United States Patent [19]
Golab

[11] Patent Number: 4,806,793
[45] Date of Patent: Feb. 21, 1989

[54] SIGNATURE CIRCUIT RESPONSIVE TO AN INPUT SIGNAL

[75] Inventor: James S. Golab, Austin, Tex.

[73] Assignee: Motorola, Inc., Schaumburg, Ill.

[21] Appl. No.: 104,007

[22] Filed: Oct. 2, 1987

[51] Int. Cl.$^4$ .......................................... H03K 19/003
[52] U.S. Cl. ............................... 307/443; 307/202.1; 307/441; 307/451; 307/219
[58] Field of Search ...................... 307/202.1, 441, 443, 307/448–449, 451, 463, 465, 468, 469, 219

[56] References Cited

U.S. PATENT DOCUMENTS

| | | | |
|---|---|---|---|
| 4,417,154 | 11/1983 | Kuo | 307/202.1 |
| 4,428,068 | 1/1984 | Baba | 307/202.1 X |
| 4,446,534 | 5/1984 | Smith | 307/202.1 X |
| 4,480,199 | 10/1984 | Varshney et al. | 307/202.1 X |
| 4,613,959 | 9/1986 | Jiang | 307/441 X |
| 4,641,285 | 2/1987 | Sasaki et al. | 307/441 X |
| 4,716,302 | 12/1987 | Flannagan et al. | 307/202.1 X |

OTHER PUBLICATIONS

Thoma, "Fuse State Detector and Inverter", IBM T.D.B., vol. 20, No. 4, Sep. 1977, pp. 1315–1316.

Sud et al, "Designing Static RAMs for Yield as Well as Speed", Electronics, Jul. 1981, pp. 121–126.

*Primary Examiner*—David Hudspeth
*Attorney, Agent, or Firm*—James L. Clingan, Jr.

[57] ABSTRACT

An integrated circuit has a signature circuit which provides information concerning the integrated circuit itself. This information can, for example, specify that redundancy has or has not been implemented. Other potential information can relate to the particular mask set, the speed of the integrated circuit, and/or the manufacturer. The information is provided on a normal output terminal of the integrated circuit. A load is selectively coupled to the output terminal in response to an input signal of the integrated circuit if a particular node is programmed to a first logic state. If the particular node is programmed to a second logic state, the load is not responsive to the input signal. A load variation then indicates one condition of the integrated circuit, and no load variation indicates another condition. Numerous outputs can be similarly used to provide additional amounts of information according to some selected code.

18 Claims, 1 Drawing Sheet

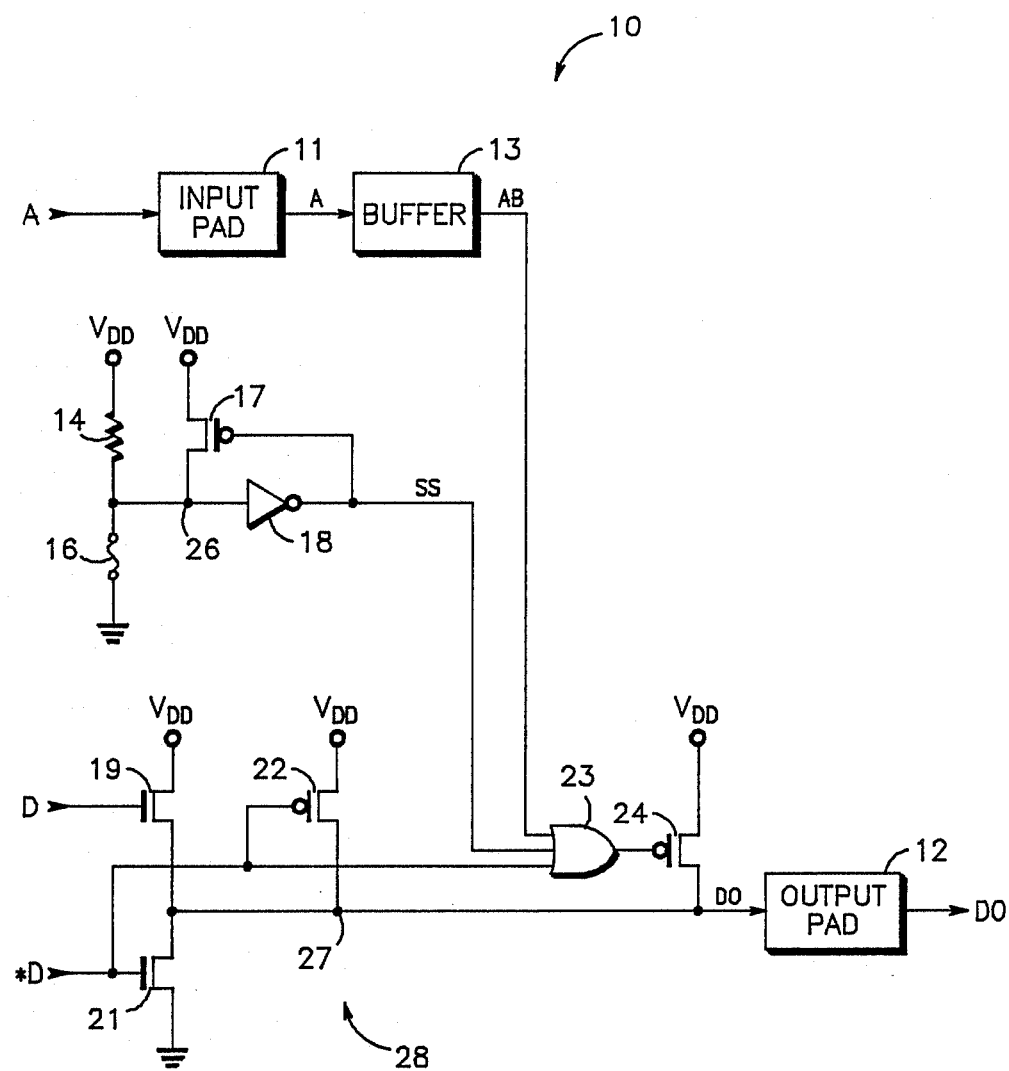

SIGNATURE CIRCUIT RESPONSIVE TO AN INPUT SIGNAL

FIELD OF THE INVENTION

The present invention relates to integrated circuit signature circuits, and more particularly, to signature circuits which are responsive to an input signal.

BACKGROUND OF THE INVENTION

In integrated circuits, there has developed a need for identifying a particular integrated circuit based on some characteristic of the integrated circuit. In the case of memories there is often the capability of repairing a particular memory by using what is commonly known as redundancy. There are included redundant rows and/or columns on the particular integrated circuit memory. If one of the regular rows or columns is defective, a redundant row or column is used to replace the defective one. There has become a desire for knowing if the particular memory is one in which a redundant row or column has replaced a regular row or column. Another identity need is for distinguishing between mask sets. A particular type of memory or other device may be manufacturable from two different mask sets. It is desirable to know from which mask set the device was made. One of the techniques which has been developed for indicating this is having a diode-connected transistor coupled between an input and a power supply terminal. The input can be driven so as to forward bias this diode-connected transistor and current can be detected to identify the integrated circuit as having one characteristic. To identify a second characteristic of the integrated circuit, the diode-connected transistor is decoupled, in the case of redundancy, from the input and/or power supply terminal so that no current flows between the input and the power supply terminal even when the diode-connected transistor is forward biased. For mask set identity, this diode-connected transistor simply is not present so that no current flows. There are any number of different characteristics for which a device may be identified. In the case of redundancy it is desirable to be able to perform the identity function with fuses. In other cases, such as mask identity, the circuit useful for allowing the detection can simply be present or not present. Additionally, more than two characteristics can be distinguished by having more than one input selectively provided with circuitry susceptible to being detected.

This input diode type of identity was fine until ESD protection began including another diode which was connected between VDD and the input terminal. An approach which overcame this new problem is described in U.S. patent application Ser. No. 945,253, now U.S. Pat. No. 4,716,302 entitled "Identity Circuit For An Integrated Circuit Using a Fuse and Transistor Enabled By a Power-On-Reset Signal," Flannagan et al. The approach described in that patent application used the power-on-reset signal for providing signature information. There are potential difficulties in relying on a powr-on-reset signal because the provided power-up of the power supply voltage of a tester of a purchaser of the particular integrated circuit may not result in a signal which is easily detected by the purchaser's tester.

SUMMARY OF THE INVENTION

An object of the present invention is to provide an improved signature circuit.
Another object of the invention is to provide an improved signature circuit which uses an input signal.
Yet another object of the invention is to provide an integrated circuit with an improved signature circuit which uses an input signal and an output terminal of the integrated circuit.

These and other objects are achieved in a integrated circuit having an input terminal for receiving an input signal, an output circuit for providing an output signal at an output terminal, and a signature circuit. The signature circuit comprises a programmable element and a load circuit. The programmable element is selectively provided at one of a first and a second state. The load circuit is coupled to the programmable element and is selectively coupled to the output terminal in response to the input signal when the programmable element is in the first state.

BRIEF DESCRIPTION OF THE DRAWINGS

The sole FIGURE is a combination logic, block, and circuit diagram of a portion of an integrated circuit according to a preferred embodiment of the invention.

DESCRIPTION OF THE INVENTION

Shown in the sole FIGURE is a portion 10 of an integrated circuit memory comprising an input pad 11, an output pad 12, an input buffer 13, a resistor 14, a fusible link 16, a P channel transistor 17, an inverter 18, an N channel transistor 19, an N channel transistor 21, a P channel transistor 22, an OR gate 23, and a P channel transistor 24. Input pad receives externally generated address signal A. Buffer 13 has an input coupled to input pad 11, and an output for providing buffered address signal AB. Resistor 14 has a first terminal connected to a positive power supply terminal VDD for receiving a positive power supply voltage of, for example, 5 volts, and a second terminal connected to a node 26. Fusible link 16 has a first terminal connected to ground, and a second terminal connected to node 26. Inverter 18 has an input connected to node 26, and an output for providing signature signal SS. Transistor 17 has a gate connected to the output of inverter 18, a source connected to VDD, and a drain connected to node 26. Transistor 19 has a gate for receiving a data signal D, a drain connected to VDD, and a source connected to a node 27. Transistor 21 has a gate for receiving complementary data signal *D, a drain connected to node 27, and a source connected to ground. Transistor 22 has a source connected to VDD, a drain connected to node 27, and a gate for signal *D. OR gate 23 has a first input for receiving signal AB from buffer 13, a second input for receiving signal SS from form inverter 18, a third input for receiving signal *D, and an output. Transistor 24 has a gate connected to the output of OR gate 23, a source connected to VDD, and a drain connected to node 27. Output pad 12 is connected to node 27.

Fusible link 16 is any conventional integrated fuse which can be selectively opened. A typical integrated circuit fuse is made of polysilicon and is selectively opened by either electrical means or a laser. Signal A is one of a plurality of address signals chosen for convenience. Buffer 13 is a conventional input buffer which buffers signal A to provide signal AB. Buffer 13 may be selectively enabled and disabled by other signals such as a chip enable signal. The conditions under which buffer 13 may or may not be enabled are not of interest to the present invention. The case of interest is the case in which signal A is simply buffered. Transistors 19, 21, and 22 form a conventional output driver 28 which responds to complementary input signals to output a signal, signal DO, external to the integrated circuit via an output pad, pad 12. Signals D and *D are signals internally generated by the integrated circuit of which circuit 10 is a portion. Signals D and *D are representative of, for example, data stored in a memory location.

Fusible link 16 is opened when the memory has replaced rows and/or columns with redundant rows and/or columns. Thus, fusible link as an open circuit indicates that redundancy has been implemented and, as a closed circuit, indicates that the memory has not been altered. When fusible link 16 is open, VDD is coupled to the input of inverter 18 via resistor 14 so that inverter 18 provides signal SS at a logic low. Transistor 17 is conductive and operates to hold node 26 at a logic high. Resistor 14 is chosen to be of very high resistance so that absent transistor 17, node 26 would be susceptible to noise. With signal SS at a logic low, OR gate 23 will respond to signals *D and AB. Signal *D, because it is representative of a memory location, is selectable by a user to be either a logic low or a logic high. To perform a signature test, signal *D is selected to be a logic low. With signal *D at a logic low, OR gate 23 is responsive to only signal AB. OR gate 23 thus provides its output at the same logic state as that of signal A. Thus if signal A is a logic high, the gate of transistor 24 is at a logic high, making transistor 24 non-conductive. On the other hand, if signal A is a logic low, the gate of transistor 24 is a logic low so that transistor 24 is conductive. Thus, the conductivity of transistor 24 is responsive to signal A, an input signal of the integrated circuit when fusible link is opened, which is one of its states.

When fusible link 16 is not opened, the other of its two possible states, the input to inverter 18 is grounded so that the output of inverter 18 provides signal SS at a logic high. With signal SS at a logic high, transistor 17 is non-conductive and OR gate 23 is forced to provide a logic high output. With the gate of transistor 24 at a logic high, transistor 24 is non-conductive. With OR gate 23 forced to provide a logic high output by virtue of fusible link 16 providing a conduction path between node 26 and ground, the conductivity of transistor 24 is not responsive to signal A.

The state of fusible link 16 can thus be detected by determining if the conductivity of transistor 24 is responsive to signal A. If the conductivity of transistor 24 is responsive to signal A, fusible link 16 is in its open state. If the conductivity of transistor 24 is not responsive to signal A, fusible link 16 is in its conductive state. Any conventional tester can be made to determine if there is a change in the output current at an output pad. When transistor 24 is conductive, there will be more output current at pad 12 than when transistor 24 is non-conductive. This test can be performed by externally placing a resistor between pad 12 and ground. When transistor 24 is conductive, the voltage at pad 12 will be higher than when transistor 24 is non-conductive.

The programmability of the logic state of node 26 has been described as being achieved by fusible link 16. This is particularly convenient for providing information with respect to characteristics which vary between integrated circuits derived from the same mask set. Another characteristic which may be desirable to know about a particular integrated circuit is its actual speed. Generally integrated circuits are sold as being as least as fast as some particular speed parameter such as access time. The integrated circuit may in fact be much faster than that. A user may want to know more accurately as to what its actual speed characteristic is. Another potential use is for the benefit of the manufacturer in gathering statistical data. Using multiple outputs, a code could be established which would provide information as to, for example, failure modes and reasons for implementing redundancy.

There are other characteristics, however, which do not vary from one integrated circuit to another from the same mask set but which a user may want to know. One common example is the manufacturer. Another is the particular mask set. It is common in memories for example for a new mask set to be used for providing the same function. The improvement is commonly reduced die size while retaining substantially the same performance. These two examples are cases in which node 26 could be programmed to provide information about the integrated circuit but which could be done as part of the regular process. Thus, the utility is not limited to the use of a fusible link for programming the state of node 26.

The approach is also not limited to adding a P channel transistor as a selectively added load in response to an external signal when the programmable element is in a particular state. The selectively added load could be an N channel transistor added between node 27 and ground. The operation would be essentially the same, except that output driver 28 would provide a logic low output for the signature test condition. The N channel transistor would be held non-conductive for one condition of the programmable element and would be responsive to the external signal for the other state of the programmable element. An external input signal other than an address signal could also be used for selectively coupling the load to the output terminal. An output could also have both an N channel and a P channel selectively added. In such a case the P and N channel transistors would be clocked separately.

The control of OR gate 23 by signal *D is to save power during normal operation. If signal SS is provided at a logic low during normal operation, the conductivity of transistor 24 would be controlled by signal A unless signal *D ensured that OR gate provided a logic high output when output driver provided signal DO at a logic low. When signal *D is a logic high, transistor 21 is conductive so that if transistor 24 were also conductive, there would be a current path between VDD and ground via transistors 24 and 21. This is the reason that signal *D is used to disable transistor 24 during the logic low output condition of signal DO. With transistor 24 disabled during the logic low condition of signal DO, the signature test also cannot be run. If the extra current drain during normal operation was not of concern, the signature test could be run during a logic low output of signal DO.

Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

I claim:

1. In an integrated circuit having an input terminal for receiving an input signal and an output terminal at which is provided an output signal, an identity circuit, comprising:
   programmable means for selectively being in one of a first state and a second state;
   detection means, coupled to the programmable means, for providing a control signal at a logic state which is indicative of the state of the programmable means;
   output means, coupled to the output terminal, for providing the output signal to the output terminal at one of a first logic state and a second logic state in response to an internal signal generated internally to the integrated circuit, said first logic state characterized as being provided by coupling a first power supply terminal to the output terminal through a first load;
   load means, coupled to the output terminal, for providing a second load between the output terminal and the first power supply terminal in response to a signature signal; and
   logic means, coupled to the detection means, the input terminal, and the output means, for providing the signature signal responsive to the input signal when the output circuit provides the output signal at the first logic state and the control signal is in the logic state which indicates that the programmable means is in the first state.

2. The integrated circuit of claim 1, wherein the load means is a first transistor having a control electrode for receiving the signature signal, a first current electrode coupled to the first power supply terminal, and a second current electrode coupled to the output terminal.

3. The integrated circuit of claim 2 wherein the logic means further comprises an input buffer for receiving the input signal and for providing a buffered signal in response thereto.

4. The integrated circuit of claim 3 wherein the logic means comprises a logic gate having a first input for receiving the buffered signal, a second input for receiving the control signal, a third input for receiving the internal signal, and an output coupled to the control electrode of the first transistor for providing the signature signal to the first transistor.

5. The integrated circuit of claim 4 wherein the detection means comprises:
   an inverter having an input coupled to the programmable means, and an output for providing the control signal; and
   a second transistor having a control electrode coupled to the output of the inverter, a first current electrode coupled to the first power supply terminal, and a second current electrode coupled to the input of the inverter.

6. The integrated circuit of claim 5 wherein the programmable means comprises:
   a fusible link having a first terminal coupled to the input of the inverter, and a second terminal coupled to a second power supply terminal;
   a resistor having a first terminal coupled to the first power supply terminal, and a second terminal coupled to the input of the inverter.

7. In an integrated circuit having an input terminal for receiving an input signal and an output circuit coupled to an output terminal for providing an output signal at the output terminal in response to an internal signal provided internally to the integrated circuit, a signature circuit, comprising:
   a load having a first terminal coupled to a first power supply terminal, and a second terminal;
   fuse means, coupled between the second terminal of the load, and a second power supply terminal, for being selectively opened;
   an inverter having a first terminal coupled to the second terminal of the load, and an output coupled to the load means; and
   load means, coupled to the output of the inverter and the input terminal, for being selectively coupled to the output terminal responsive to the input signal when the fuse means is opened.

8. The integrated circuit of claim 7, wherein the fuse means comprises:
   a fusible link having a first terminal coupled to the second terminal of the load, and a second terminal coupled to the second power supply terminal.

9. The integrated circuit of claim 8, wherein the load means comprises:
   an input buffer having an input for receiving the input signal, and an output for providing a buffered signal;
   a logic circuit having a first input for receiving the buffered signal, a second input coupled to the output of the inverter, and an output;
   a first transistor having a control electrode coupled to the output of the logic circuit, a first current electrode coupled to the first power supply terminal, and a second current electrode coupled to the output terminal.

10. The integrated circuit of claim 9 wherein the logic circuit is further characterized as having a third input coupled to the output circuit.

11. The integrated circuit of claim 7, wherein the load means comprises:
   an input buffer having an input for receiving the input signal, and an output for providing a buffered signal;
   a logic circuit having a first input for receiving the buffered signal, a second input coupled to the inverter, and an output;
   a first transistor having a control electrode coupled to the output of the logic circuit, a first current electrode coupled to the first power supply terminal, and a second current electrode coupled to the output terminal.

12. The integrated circuit of claim 11 wherein the logic circuit is further characterized as having a third input coupled to the output circuit.

13. In an integrated circuit having a first power supply terminal, a second power supply terminal, an input terminal for receiving an input signal recognized as being at one of a first and a second logic state, and an output circuit coupled to an output terminal for providing an output signal at the output terminal in response to an internal signal provided internally to the integrated circuit, the input signal being recognized as being in the first logic state if the input signal is at the voltage at the first power supply terminal and in the second logic state if the input signal is at the voltage at the second power supply terminal, a signature circuit, comprising:
   a load having a first terminal coupled to the first power supply terminal, and a second terminal;
   fuse means, coupled between the second terminal of the load, and a second power supply terminal, for being selectively opened;

an inverter having a first terminal coupled to the second terminal of the load, and an output coupled to the load means; and load means, coupled to the output of the inverter and the input terminal, for being selectively coupled to the output terminal in response to the input signal being recognized as being in the first logic state when the fuse means is opened.

14. The integrated circuit of claim 13, wherein the fuse means comprises:

a fusible link having a first terminal coupled to the second terminal of the load, and a second terminal coupled to the second power supply terminal.

15. The integrated circuit of claim 14, wherein the load means comprises:

an input buffer having an input for receiving the input signal, and an output for providing a buffered signal;

a logic circuit having a first input for receiving the buffered signal, a second input coupled to the output of the inverter, and an output;

a first transistor having a control electrode coupled to the output of the logic circuit, a first current electrode coupled to the first power supply terminal, and a second current electrode coupled to the output terminal.

16. The integrated circuit of claim 15 wherein the logic circuit is further characterized as having a third input coupled to the output circuit.

17. The integrated circuit of claim 13, wherein the load means comprises:

an input buffer having an input for receiving the input signal, and an output for providing a buffered signal;

a logic circuit having a first input for receiving the buffered signal, a second input coupled to the programmable means, and an output;

a first transistor having a control electrode coupled to the output of the logic circuit, a first current electrode coupled to the first power supply terminal, and a second current electrode coupled to the output terminal.

18. The integrated circuit of claim 17 wherein the logic circuit is further characterized as having a third input coupled to the output circuit.

* * * * *